(12) United States Patent
Lesesky et al.

(10) Patent No.: US 9,037,428 B2
(45) Date of Patent: May 19, 2015

(54) DATA COLLECTION DEVICE AND ASSOCIATED SYSTEM FOR MONITORING AND STORING PERFORMANCE AND MAINTENANCE DATA RELATED TO A COMPONENT OF AN ELECTRICAL SYSTEM

(75) Inventors: Alan C. Lesesky, Charlotte, NC (US);
Bruce A. Purkey, Rogers, AR (US);
Bobby Ray Weant, Rock Hill, SC (US)

(73) Assignee: Battery Dynamics Group, LLC, Rogers, AR (US)

( * ) Notice: Subject to any disclaimer, the term of this patent is extended or adjusted under 35 U.S.C. 154(b) by 0 days.

(21) Appl. No.: 13/550,179

(22) Filed: Jul. 16, 2012

(65) Prior Publication Data

US 2013/0018544 A1    Jan. 17, 2013

Related U.S. Application Data

(63) Continuation of application No. 12/416,623, filed on Apr. 1, 2009, now Pat. No. 8,224,597, which is a continuation of application No. 11/901,631, filed on Sep. 18, 2007, now abandoned, which is a continuation (Continued)

(51) Int. Cl.
*G06F 19/00* (2011.01)
*H01M 10/44* (2006.01)
(Continued)

(52) U.S. Cl.
CPC .......... *H01M 10/441* (2013.01); *G01R 31/006* (2013.01); *G01R 31/007* (2013.01);
(Continued)

(58) Field of Classification Search
CPC . G06F 3/04842; G06F 3/0482; G06F 3/0488; G06F 3/04817

USPC .............. 702/63, 64, 182–185, 188
See application file for complete search history.

(56) References Cited

U.S. PATENT DOCUMENTS

| 5,175,531 A | 12/1992 | Whitmire et al. |
| 5,250,894 A | 10/1993 | Bridges et al. |

(Continued)

FOREIGN PATENT DOCUMENTS

GB    2 339 943    2/2000

OTHER PUBLICATIONS

International Search Report for App. No. PCT/US02/25254, dated Jan. 1, 2003.

(Continued)

*Primary Examiner* — Edward Raymond
(74) *Attorney, Agent, or Firm* — Alston & Bird LLP (57) ABSTRACT

The present invention provides systems and methods for testing and storage of information related to a component. A data collection device having a memory is fixedly connected to the component. A test device communicates with the data collection device to store test data concerning the component in the data collection device. The test device also performs analysis of the test data and provides information concerning the health and maintenance history of the component. The present invention also provides systems and methods for determining the current drawn or supplied by electrical components connected in parallel in an electrical system. A current sensor located between the electrical components determines the current supply or draw of one of the electrical components, while a current sensor between the electrical components and the remainder of the electrical system determine a cumulative current draw or supply by both the electrical components.

19 Claims, 5 Drawing Sheets

Related U.S. Application Data of application No. 11/351,596, filed on Feb. 10, 2006, now Pat. No. 7,272,519, which is a continuation of application No. 10/215,347, filed on Aug. 7, 2002, now abandoned.

(60) Provisional application No. 60/310,716, filed on Aug. 7, 2001.

(51) Int. Cl.
  *H01M 10/48* (2006.01)
  *G01R 31/00* (2006.01)
  *G01R 31/36* (2006.01)

(52) U.S. Cl.
  CPC ......... *G01R31/3606* (2013.01); *G01R 31/3648* (2013.01); *G01R 31/3675* (2013.01); *G01R 31/3679* (2013.01); *G01R 31/3693* (2013.01); *H01M 10/482* (2013.01)

(56) References Cited

U.S. PATENT DOCUMENTS

| | | | |
|---|---|---|---|
| 5,483,827 A * | 1/1996 | Kulka et al. ............... 73/146.5 |
| 5,557,189 A | 9/1996 | Suzuki et al. |
| 5,627,472 A | 5/1997 | Ofer et al. |
| 5,760,587 A | 6/1998 | Harvey |
| 5,798,577 A | 8/1998 | Lesesky et al. |
| 5,945,804 A | 8/1999 | Hansson et al. |
| 5,963,012 A | 10/1999 | Garcia et al. |
| 6,084,523 A | 7/2000 | Gelnovatch et al. |
| 6,150,793 A | 11/2000 | Lesesky et al. |
| 6,208,039 B1 | 3/2001 | Mendelsohn et al. |
| 6,316,914 B1 | 11/2001 | Bertness |
| 2003/0055666 A1 | 3/2003 | Roddy et al. |
| 2004/0012396 A1 | 1/2004 | Batson |
| 2009/0088924 A1 | 4/2009 | Coffee et al. |
| 2010/0201516 A1 | 8/2010 | Gelvin et al. |

OTHER PUBLICATIONS

Glover, et al.; "Power Systems Analysis and Design;" PWS-Kent Publishing Company, dated 1987; pp. 20-26.

Braga, Sourcebook for Electronics Calculations, Formulas, and Tables, Prompt Publications; ISBN 0-7906-1193-7; dated 1999; pp. 41-43.

* cited by examiner

DATA COLLECTION DEVICE AND ASSOCIATED SYSTEM FOR MONITORING AND STORING PERFORMANCE AND MAINTENANCE DATA RELATED TO A COMPONENT OF AN ELECTRICAL SYSTEM

CROSS-REFERENCE TO RELATED APPLICATIONS

The present application is a continuation of U.S. patent application Ser. No. 12/416,623, filed Apr. 1, 2009, which is a continuation of U.S. patent application Ser. No. 11/901,631, filed Sep. 18, 2007, which is a continuation of U.S. patent application Ser. No. 11/351,596, filed Feb. 10, 2006, which is a continuation of U.S. patent application Ser. No. 10/215,347, filed Aug. 7, 2002, which in turn claims priority from U.S. Provisional Application Ser. No. 60/310,716 entitled SYSTEMS AND METHODS FOR MONITORING AND STORING VEHICLE CHARGING SYSTEM DATA, filed Aug. 7, 2001, the contents of which are incorporated herein by reference.

BACKGROUND OF THE INVENTION

1. Field of the Invention

This invention relates to test and diagnostic equipment used to gather and store performance and maintenance data related to a component.

2. Description of Related Art

An important concern associated with the maintenance of any vehicle is the status of the vehicle's electrical system. As the battery and alternator of a vehicle are essential to the cranking and normal operation of the vehicle, it is important that they are properly and frequently tested to ensure that they are operating correctly. For this reason, many fleet and vehicle and equipment rental companies perform routine testing and maintenance on both the batteries and alternators of their vehicles. Although a regular maintenance schedule can aid in determining problems with the electrical systems, there are some problems with current maintenance practices.

Specifically, although the fleet and vehicle and equipment rental companies have for many years used test equipment to test the health of batteries, alternators, etc., most documentation concerning the test is in written form and must be later transcribed into an electronic database. As such, there is added time associated with the maintenance procedure for data input, and also, the data is not readily available and suffers from possible user errors in entering the data. Further, the data is not directly linked to the battery or alternator. Instead, the user must determine the ID associated with the battery or alternator, and using the ID, accesses either written notes or a database. Here again, there is time lost in maintenance and also the user may access the wrong information for the battery or alternator.

An additional concern with batteries and alternators is warranty information. Many batteries returned to the manufacturer under warranty are malfunctioning not due to manufacturing defects, but instead, due to misuse and/or improper maintenance or charging of the battery. Further, some warranty claims may be dismissed as user misuse and/or improper maintenance and charging, when in reality there is an actual manufacturing problem with the battery or alternator. This problem could be eliminated if there were convenient records of maintenance and also records kept concerning whether the alternator or battery was properly tested.

An additional problem is many large vehicles, such as trucks, buses, etc. typically have more than one battery on board to start the engine and provide the electrical requirements for the vehicle. For example, the typical over the road Class 8 tractor has three (3) to four (4) Group 31 batteries on board to meet the electrical requirements and demands. A noted problem is that all the batteries look alike, the good, bad and the marginal.

Once a battery problem is noted, typically, the only way to fix the problem is to replace all of the batteries in the electrical system and test the batteries once removed from the vehicle in search for the bad and marginal batteries. This can be costly and time consuming. In addition, many of these conventional test methods individually test each battery, thereby requiring movement of the cables to each battery for testing. This again is time consuming and can damage the posts of the batteries.

Another issue is that once a battery begins to malfunction, it can have a detrimental effect on the other batteries in the system causing them to possibly degrade and fail. As such, if a problem with a battery in a bank of batteries is not identified in a timely manner, additionally batteries may be affected, thereby not only raising cost concerns but also raising environmental concerns associated with disposal of malfunctioning batteries.

Further, because the batteries are removed for testing, the batteries are not tested during the normal operational environment. As temperature, electrical loads, etc. affect the characteristics of the battery or alternator, accurate diagnostics of the battery or alternator cannot be taken.

In light of these concerns, the ability to analyze and test each individual battery on the vehicle without removing the battery cables would be valuable to the Fleets, OEMs, and suppliers. Also, the ability to test and analyze all the batteries during the vehicle's normal operation, such as starting, charging at different temperature conditions would allow users to more accurately identify bad and marginal batteries.

In broader terms, there are also concerns with general maintenance of vehicles. Currently, maintenance personnel must manually inspect maintenance parameters of the vehicle and record their findings. Significant time is spent accessing dip sticks for oil and transmission fluid level, viewing of coolant levels, removal of caps and other covers for measurement of the brake fluid, etc, and assessing brake lines, brake slack adjustment, etc. Again, there may also be errors by maintenance personnel in reading and recording these parameters.

BRIEF SUMMARY OF THE INVENTION

The present invention provides systems and methods for testing and data storage of information related to systems associated with machinery and processes in general and of vehicles in particular. The present invention provides a data collection device having memory, which is located on a component to be tested, such as a battery or alternator of a vehicle. The system further includes a test device that communicates with the data collection device to store test data concerning the component under test. The test device is also used to perform analysis of the current test data and of previous test data stored in the memory of the data collection device and provide information concerning the health of the component under test. This information can then be used to determine the life expectancy of the component and predict possible impending failures. It may further be used in determining whether warranty claims will be satisfied on defective components.

As an example, in one embodiment, the present invention provides a system that includes a data collection device that is either associated with and/or incorporated into a battery or alternator. The data collection device can be of any type including an RF-chip or a processor with an associated RF or Infrared transceiver. The data collection device has an associated memory for data storage. The system of this embodiment of the present invention further includes a test device, such as a tester or charger, for testing the component under test. Importantly, the test device is a polling device that includes electronics and an antenna for communicating with the data collection device associated with the component under test.

During testing of the component, the test device of the present invention checks several parameters. For example, if the component is a battery, the test device checks the cold cranking amps, reserve charge level, state of charge of the battery, etc. Further, if the test device is a charger, the battery may be supplied a charge over a given time period. For alternators, the test device may measure the output voltage versus current, waveform shape of the voltage output, temperature of the alternator, etc. For starter motors, the test device may measure the voltage output, waveform shape, temperature, etc. U.S. Pat. Nos. 6,150,793 and 5,798,577 both to Lesesky et al., which are owned by the Assignees of the present application, discloses various test procedures for testing various electrical components on a vehicle. The contents of these two patents are incorporated herein by reference.

Importantly, the test device of the present invention, after acquiring information concerning the component under test, transmits these parameters, along with the date and time of testing, to the data collection device associated with the component. This data in then stored in the memory associated with the data collection device as a maintenance record. Further, in some embodiments, the test device includes a keyboard or other devices that allows the user to add additional information concerning the maintenance of the battery or alternator. This information is also transmitted and stored in the memory of the data collection device. Additionally, in instances in which a charger is used to charge a battery, information concerning the charging operation, such as level of charge provided and duration of charge, can also be transferred and stored in the memory of the data collection device.

As discussed above, the memory of the data collection device includes data logs concerning maintenance performed on the component to which it is associated. In some advantageous embodiments, the memory of the data collection device includes information concerning maintenance of the component throughout its lifetime. In this instance, the initial test of the component when manufactured is stored as base line information. As such, subsequent data collected concerning the component may be stored in the memory of the data collection device and used in comparison to the original base line data to determine aging trends of the component.

In some embodiments, the data collection device is an RF-chip such as an RF-tag. The RF-chip of the present invention can be either an active or passive device. In instances in which the RF-chip is a passive device, it receives its energy for operation from the signal transmitted by the test device. Specifically, in this embodiment, when the test device wishes to either transmit data to or receive data from the RF-chip, it transmits a command or polling signal to the RF-chip. The RF-chip receives the command signal and uses the energy from the signal to operate the RF-chip. In some alternative embodiments, the RF-chip is an active element that is powered by an energy source. For example, in embodiments in which the RF-chip is connected to a battery of the vehicle, the RF-chip may be electrically connected to the posts of the battery for power.

As mentioned above, the data collection device retains data logs of periodic tests performed on the component to which it is associated. This data can be communicated to the test device where it can be analyzed or it may be analyzed by a processor associated with the data collection device or a central computing system connected to the data collection device. This analysis typically involves comparing the data to base line tests performed when the component was originally manufactured. This comparison may uncover trends overtime of the component's behavior and provide predictions on when the component is likely to experience failure. The data may also be compared to aging algorithms and other statistical data that has been created to predict the life expectancy of the component.

In addition to analyzing the data, the test device of the present invention may also store the data or transmit the data to other analysis or storage devices. For example, in one embodiment, the test device may transfer the data and analysis to a web server, where the data may be presented in a web page format. As such, the data concerning the component is made available to the various individuals concerned with the maintenance of the component.

As mentioned, in some embodiments, the data collection device is an RF-chip. In some advantageous embodiments, the system of the present invention may further include a processor connected to the RF-chip. The processor is in communication with the RF-chip for transfer and storage of information concerning the component. Further, the processor may include test probes and associated test electronics for performing the various tests on the component itself. The processor stores the test information in the memory device associated with the RF-chip and may also analyze the data. In this embodiment, the processor may not only test and store data relating to the component during routine maintenance schedules, but may actually perform periodic testing of the component during normal operation. In some embodiments, the processor may perform the tests on a continuous or periodic basis such that the health of the component is constantly analyzed.

In some embodiments, the component under test may be just one component of a much larger system. For example, the component under test could be a battery or alternator on a vehicle. In this instance, in addition to performing test and storage of the data in the memory device of the RF-chip, the processor may also be connected to the remainder of the vehicles electrical system and provide the test information to the central computer of the vehicle. In this instance, health information concerning the battery or alternator is made available via instrumentation to the user of the vehicle and for centralized data storage and analysis in the central computer. Further, known in the art are devices for transmitting data from a vehicle to a central computing facility, such as Qualcomm's satellite-based communication system or Vehicle Enhancement System's VESPLEX™ technology. The data collected by the processor may be transmitted by these systems to a central computing facility where the data is made available to those interested in the maintenance of the battery or alternator.

The system of the present invention also provides an embodiment for performing continuous or periodic measurement of the component using a passive RF-chip and processor. Specifically, in this embodiment, the polling electronics for communicating and supplying power to operate the passive RF-chip are located in close proximity to the RF-chip and processor. For example, in the case where the component is a battery, the polling electronics could be located in the battery cover. In this embodiment, the electronics periodically poles the RF-chip, and the RF-chip and processor use the energy from the polling signal to perform tests and data storage.

As mentioned above, the data collection device is typically connected to or incorporated into the component under test. In some embodiments, it is advantageous that the data collection device is connected to the external portion of the component, such that it can be applied to the component after manufacture without requiring the manufacturer to reconfigure their designs. Further, an external data collection device can be placed on existing components as an easy retrofit.

Although advantageous, placement of the data collection device and other electronics on the external portion of the component under test subjects the data collection device and electronics to several environmental factors that could damage them. For this reason, in one embodiment, the data collection device and associated electronics are surrounded or encased in a rugged housing to protect them from damage. For example, in one embodiment, the data collection device and associated electronics are surrounded or encased in plastic having an adhesive applied to one surface of the encasement for connection to the component under surveillance.

In addition to ensuring that the data collection device and electronics are not exposed to environmental elements, it is also important to ensure that the data collection device and electronics housed in the encasement are not accidentally dislodged from the component. As such, in one embodiment of the present invention, the data collection device and associated electronics may be surrounded or encased in plastic formed into a circular disc, sometimes referred to as a "poker chip" configuration. This form of encasement is advantageous, as the encasement does not have corners that may be snagged by debris and other items that may dislodge the encasement from the outer surface of the battery or alternator.

The present invention also provides systems and methods for performing other general maintenance procedures on a system containing several different components requiring surveillance. For example, if the system is a vehicle, the present invention may include various sensors located throughout the vehicle to measure operating parameters of the vehicle. For example, the system may include measurement devices associated with the crankcase, master cylinder, radiator, and transmission to measure fluid levels. It may also include sensors for measuring the temperature of various components on the vehicle. Further, sensors may be used to assess brake lines, brake stroke, brake slack adjustment etc. Associated with each sensor is a data collection device such as an RF-chip for communication and storage of the outputs of the sensor. To acquire data, the system of this embodiment further includes a test device either held by a user or located on the vehicle. The test device polls each of the RF-chips associated with the various sensors and retrieves readings from the sensors, such that data is made available for viewing and analysis. As such, in this embodiment, the maintenance personnel are not required to physically perform the measurements, but instead, merely poll the various RF-chips. Alternatively, here again, the polling device may be resident on the vehicle to take continuous or periodic measurements. Further, the data may be provided to the central computer of the vehicle and/or transmitted to a central computing station.

As mentioned above, some systems may have linked components used in conjunction with each other in the system. For example, a heavy-duty vehicle may include a plurality of batteries linked to one another for providing electrical power to the vehicle. In these systems, it is advantageous to perform diagnostic tests on each of the individual batteries to determine which batteries are functioning properly and which require replacement. In this embodiment of the present invention, the system includes a data collection device associated with each of the batteries. Each data collection device stores test and maintenance data for the battery with which it is associated, thereby providing an individual data log for the battery. In some embodiments, the data collection device is an RF-chip device that operates in conjunction with a test device that performs tests and maintenance on the battery and then transmits this information to the RF-chip, where it is logged and may be later retrieved.

In other embodiments, the data collection device may be an integrated system that includes both a test device and memory device packaged into one system for both performing test and maintenance on the battery and logging the data. For example, the data collection device may include a current, sensor such as a Hall effect sensor that senses current output of the battery. This data is then stored in the memory device, where it is logged and can be later retrieved by a local processor or other device for processing. In this way, each of the batteries can be individually tested and evaluated to determine which of the batteries is malfunctioning. The data collection devices of these embodiments may operate in a continuous or periodic manner so as to collect data on the battery during its normal operation.

The present invention also provides systems and methods for monitoring electrical components of an electrical system having at least first and second electrical components connected in parallel by a first conductor that connects terminals of the first and second electrical components together and a second conductor connecting a terminal of the first electrical component to a remainder of the electrical system. The system of this embodiment includes a first current sensing device connected between the first electrical component and the remainder of the electrical system and a second current sensing device connected between the first and second electrical components. In this configuration, when current flows from the remainder of the electrical system to the first and second electrical components, current sensed by the second current sensing device is equal to the current drawn by the second electrical component and current sensed by the first current sensing device equals the current drawn by both the first and second electrical components. Further, when current flows from first and second electrical components to the remainder of the electrical system, current sensed by the second current sensing device is equal to the current supplied by the second electrical component and current sensed by the first current sensing device equals the current supplied by both the first and second electrical components.

The system of this embodiment of the present invention may further include a processor connected to the first and second current sensors. The processor determines the current drawn and supplied by the first electrical component by subtracting the current sensed by the second current sensor from the current sensed by the first current sensor.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

As mentioned above and provided in more detail below, the present invention provides systems and methods for collecting, logging, and analyzing test and maintenance data for a component. Importantly, the systems and methods of the present invention include a data collection device that is associated and/or connected to the component. Each time the component is tested or maintenance is performed thereon, the data concerning the tests and maintenance is stored in the data collection device. As such, the data collection device of the present invention creates an archival record concerning the component, which can be downloaded for observation and analysis to assess the health and performance of the component. The data may be analyzed by a remote unit or a local processor.

In the embodiments described below, the component is described as either an alternator or battery of a vehicle. This discussion should not limit the scope of components with which the systems and methods of the present invention may be used. It is understood that the systems and methods may be used with any type of component that requires testing and maintenance. The components can be sensors, actuators, motors, etc.

In general, the systems and methods of the present invention may assume several different forms depending on the application. For example, in some embodiments, the data collection device of the present invention may be a storage device with an associated transceiver and the test device may be a hand held unit that tests and performs maintenance on a component, and then transmits test and maintenance data to the data collection device for storage. In some embodiments, the test device may be a unit that is permanently or semi-permanently located in close proximity to the component where it continuously or periodically tests and performs maintenance on the component and stores the data in the data collection device. In further embodiments, the system is integrated such that the data collection device includes both a test device for performing tests and maintenance on the component and a storage device for storing test and maintenance data. The integrated data collection system of this embodiment includes a transceiver for transmission of the data to remote computing systems. Further, the data collection system of this embodiment may further include a processor for analyzing the collected test and maintenance data.

An important aspect of the present invention is that data related to the test and maintenance of a component is stored on a data collection device associated with the component. In many instances the data collection device is fixedly connected to the component. This allows for ready access of information related to the history of the component by merely polling the data collection device associated with the component for archival data. As such, the entire history of a component can be accessed at any time for determinations of the health and aging of the component.

Figure 1:
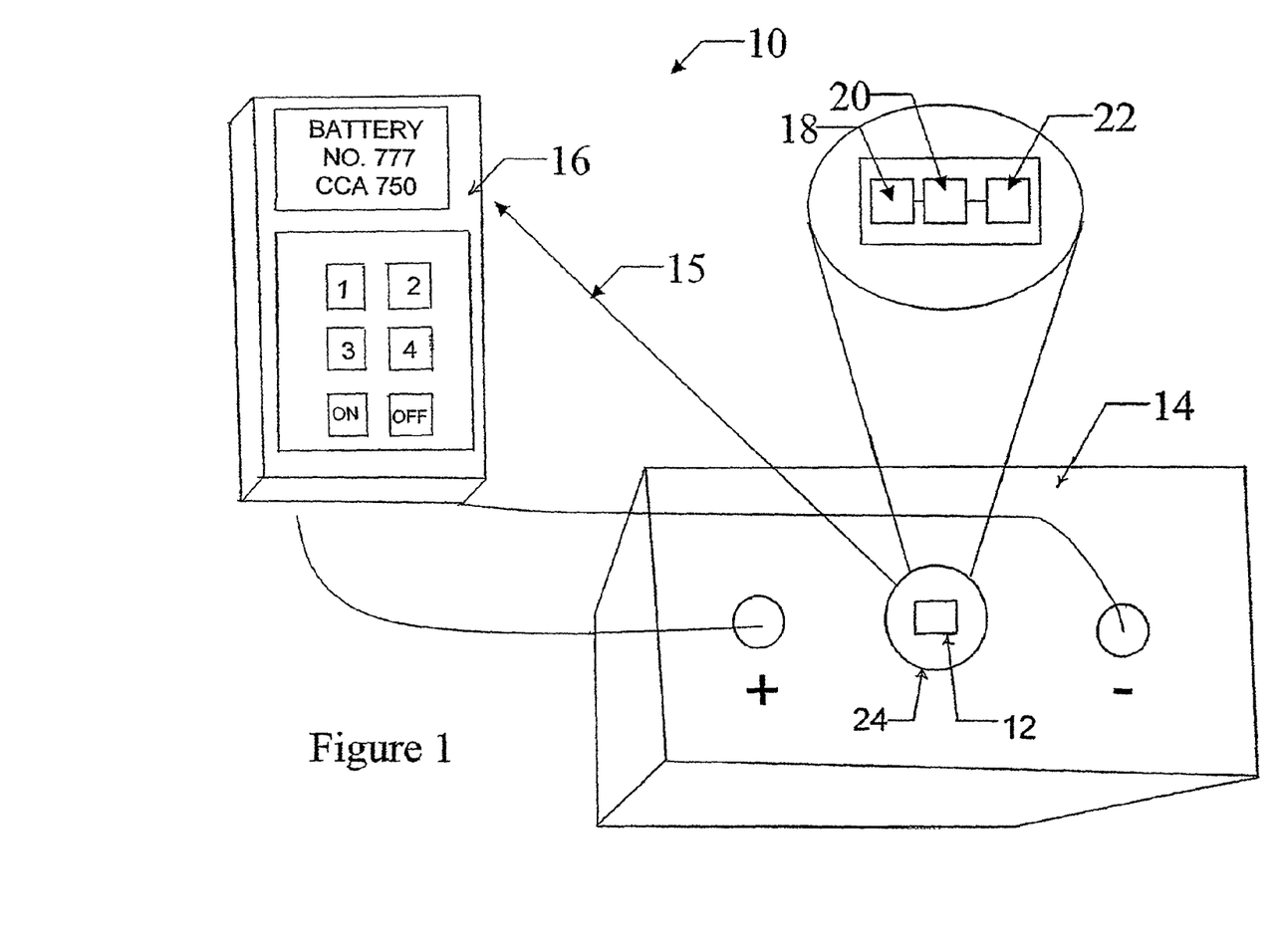
FIG. 1 depicts a system according to one embodiment of the present invention for testing and storing data related to a battery.

FIG. 1 is an illustration of one embodiment of the systems and methods of the present invention. This figure illustrates use of the systems and methods with a battery as a component. It is understood that the battery is just used as an example and could be replaced by any other component under test. As illustrated, the system 10 of this embodiment includes a data collection device 12 physically connected to a battery 14. Electrically connected to the battery is a test device 16, such as a tester or charger. Resident in the test device is a transceiver and electronics, not shown, for communication with the data collection device 12. The data collection device also includes an antenna 18 and electronics 20 for communicating with the test device. Further and importantly, the data collection device also includes memory 22 for storing information provided to the data collection device by the test device via communication link 15. The data collection device, in some embodiments, may also include an internal clock for providing time and date stamps for the logged information.

In operation, the test device performs testing on the battery to determine parameters related to the health of the battery. Further, in some embodiments, the test device may also apply a charge to the battery for a duration of time. The testing parameters may include the cold cranking amps, reserve charge level, state of charge of the battery, etc. After the test device has received the data, the test device then transfers the data via the transceiver electronics to the data collection device. The data collection device receives the data and stores the data in the associated memory. The data is stored in the form of a data log along with the time and date indicating when the tests were performed. Alternatively, the test device may provide the time and date stamp along with the data to the data collection device. In addition to the test data and the time and date stamp, the test device may also transmit additional information for storage in the data collection device, such as the fleet name, vehicle number, any comments made by the technician when performing the test, the amount and duration of charge applied to the battery during charging, etc.

Importantly, over time, the data collection device of the present invention will include a series of data entries chronicling the data from the various tests and maintenance procedures ran on the battery over its lifetime. As such, there is a convenient history of the battery's performance associated with the battery in electronic form.

In addition to performing tests on the battery, the test device may also analyze the battery's health to predict possible failures and possible life expectancy. Specifically, as mentioned, the memory associated with the data collection device includes test results for previous tests performed on the battery, and in some instances, includes base line test data taken and stored at the time the battery was originally manufactured. By downloading and analyzing this data in light of the current test results, the test device of the present invention can compare the various test results over time. This comparison may uncover trends of the battery's behavior and provide predictions on when the battery is likely to experience failure. The data may also be compared to aging algorithms and other statistical data that has been created to predict the life expectancy of the battery. In this regard, U.S. Pat. Nos. 6,150,793 and 5,798,577 both to Lesesky et al., which are owned by the Assignees of the present application, discloses various test procedures for testing various electrical components on a vehicle. The contents of these two patents are incorporated herein by reference.

In FIG. 1, the system of the present invention is illustrated in conjunction with a battery. It is understood, however, that the present invention is also contemplated for use with alternators, starter motors, and may also be used with many different systems on a vehicle to collect and store data concerning the systems.

As illustrated in FIG. 1, the data collection device of the present invention is typically fixedly connected to the external surface of the component. It must be understood that the data collection device could be instead incorporated in the housing of the component. However, it is typically attached to the outside of the component so that manufacturers do not have to redesign the component to accommodate the data collection device and so that existing components in the field can be easily upgraded with this technology.

As the data collection device and any electronics associated therewith are typically attached to the outside of the component, they may be subjected to damage from environmental elements. Further, the data collection device and associated electronics may also become detached from the component due to handling, packaging, installing, etc. In light of this, in one embodiment, the data collection and associated electronics of the present invention are surrounded or encased in a durable, rugged material such as plastic. Specifically, with reference to FIG. 2, the data collection device 12 and other associated electronics, (such as an associated processor), are surrounded or encased in a durable material 24 such as plastic, epoxy, rubber, or other similar material. The encasement shields the data collection device and associated electronics from environmental elements that could disrupt the operation or damage the data collection device and electronics. To connect the encased data collection device to the component, the encasement 24 may further include an adhesive material 26 applied to one surface of the encasement. The adhesive material has requisite strength to bond the encasement to the component, however, the strength of the adhesive is typically chosen such that the encasement may be removed, if necessary. In an alternative embodiment, a laminate may be placed over the encasement and a portion of the surface of the component to thereby adhere the encasement to the component. Other methods of attaching the data collection device to the component are contemplated by the invention such as mechanical fasteners, pouches, etc.

Figures 2, 3:
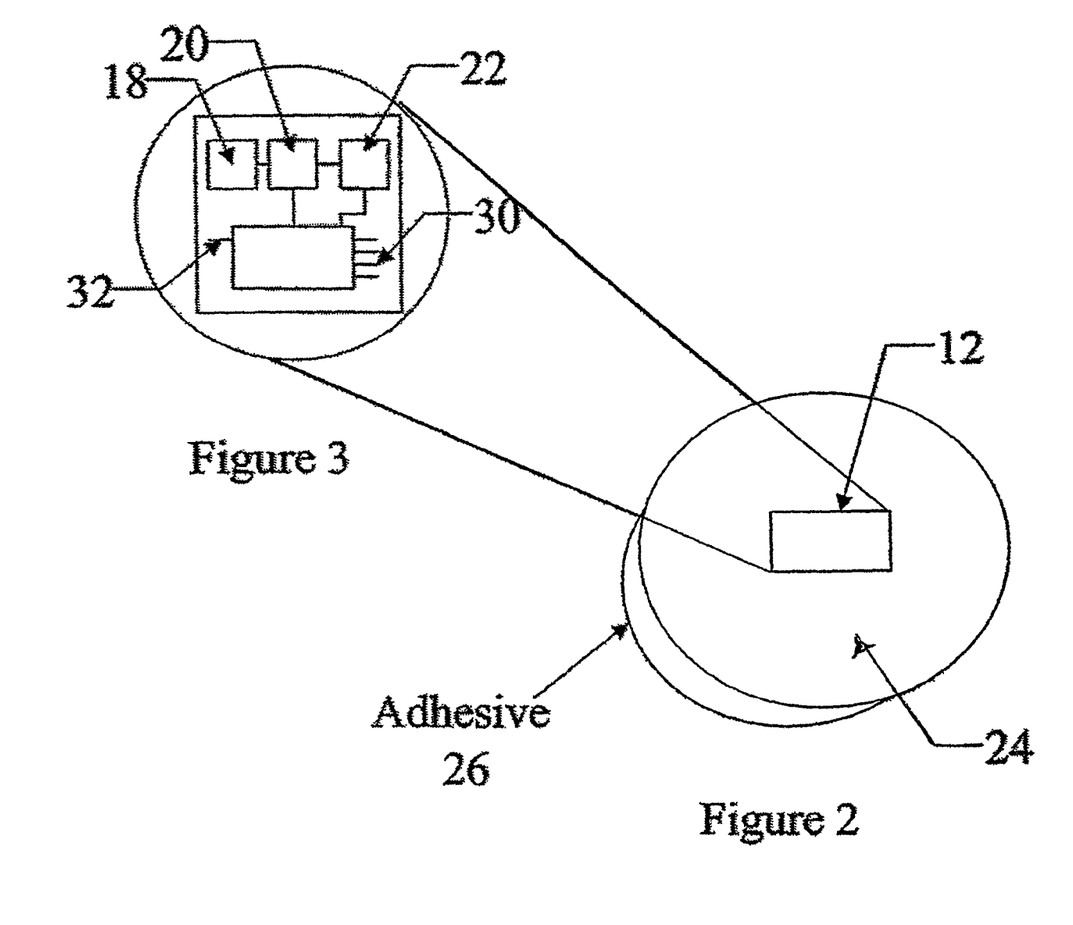
FIG. 2 illustrates encasement of the system of the present invention in a housing for environmental protection and attachment to an associated component according to one embodiment of the present invention.
FIG. 3 depicts a system similar to that of FIG. 1 further including a processor for performing test and analyzing data according to one embodiment of the present invention.

In addition to ensuring that the data collection device and electronics are not exposed to environmental elements, it is also important to ensure that the data collection device and electronics housed in the encasement are not accidentally dislodged from the component. As such, in one embodiment of the present invention, the encasement is formed into a circular disc, sometimes referred to as a "poker chip" configuration. The circular disc is cylindrical in shape with a body extending between exposed circular ends. The disc has a relatively short body such that it is low profile when adhered to the component. As illustrated in FIG. 2, it has the appearance of a poker chip. This form of encasement is advantageous, as the encasement does not have corners that may be snagged by debris and other items that may dislodge the encasement from the outer surface of the component.

As discussed above, the data collection device is associated with the component and communicates with the test device. The data collection device may have many configurations. For example, it could be composed of processor, storage device, and transceiver, where the transceiver communicates with test device for receiving and transmitting archival data, while the processor either controls the storage device to either store data or retrieves data from the storage device for transmission to the test device. In some instances, the data collection device is a RF-chip, sometimes referred to in the industry as an RF-tag. Depending on the embodiment, the RF-chip of the present invention can be either an active or passive device. In instances in which the RF-chip is a passive device, it receives its energy for operation from the signal transmitted by the test device as known to those skilled in the art. Specifically, in this embodiment, when the test device wishes to either transmit data to or receive data from the RF-chip, it transmits a command signal to the RF-chip. The RF-chip receives the command signal and uses the energy from the signal to operate the RF-chip.

Alternatively, in some embodiments, the RF-chip is an active element that is powered by an energy source connected to the RF-chip. The energy source may be an associated battery pack. However, in some embodiments, in which the RF-chip is connected to a battery of a vehicle, the RF-chip may be electrically connected to the posts of the battery for power, as opposed to having its own associated battery pack.

As illustrated in FIG. 1, a test device 16 is used to test the component and to poll the data collection device to receive and store data concerning the component. As a general matter, the test device is of any type suitable for performing tests on the component. For example, where the component is a battery, the test device is a battery tester and/or charger for testing the current and voltage of the battery. The test data is collected and assembled into a data file. The test device may add a time and date stamp indicating when the data was taken or this may be added by the data collection device. The data is then transmitted to the data collection device where it is stored for later retrieval.

Although FIG. 1 illustrates the test device as a hand held unit, it must be understood that the test device may take many forms. For example, with reference to FIG. 3, in one embodiment of the present invention, the test device and data collection device are integrated. Specifically, in this embodiment, the data collection device further includes a processor 28 that is in electrical communication with the antenna 18, electronics 20, and memory 24 of the data collection device. The processor includes various test probes 30 and electronics for connection to the component. In instances, in which the system is connected to battery, the processor may also include a voltage input 32 connected to the vehicle battery for power input.

During operation, the processor, using the test probes and electronics, performs the various tests on the battery or alternator and communicates this data to the memory device 24 where it is stored. In addition to performing the test, the processor may also include software for performing analysis of the readings and comparisons of the current readings with the historical data. Information concerning this analysis may also be stored into memory. Importantly, because the processor is associated with the component at all times, it can perform testing of the component on a continuous or periodic basis, if desired. As such, the health of the component can be constantly analyzed and any problems with the component can be determined at an early stage.

In some instances, the component to which the data collection device of the present invention is associated may be part of an overall system that includes a plurality of components. For example, a battery or alternator may be placed in a vehicle having a wide variety of other components and a central computing system. In this instance, in addition to performing test and storage of the data, the processor may also be connected to the remainder of the vehicles electrical system and provide the test information to the central computer of the vehicle. Health information concerning the battery or alternator is made available via instrumentation to the user of the vehicle and for centralized data storage and analysis in the central computer. Further, known in the art are devices for transmitting data from a vehicle to a central computing facility, such as Qualcomm's satellite-based communication system or Vehicle Enhancement System's VESPLEX™ technology. The data collected by the processor may be transmitted by these systems to a central computing facility where the data is made available to those interested in the maintenance of the battery or alternator. Further, as in FIG. 1, the data may be accessed by a hand held test device when the battery or alternator is later analyzed during maintenance of the vehicle. Additionally, the data may be provided to a web-server in the form of a web page for use on either the Internet or a company's intranet site.

FIG. 1 illustrates an embodiment where the data collection device is located on the component and a hand held device is used to test and perform maintenance on the component and transmit the test data to the data collection device for archival. In typical embodiments, the data collection device is an RF-tag either containing or associated with a memory 24. Data collected by the test device is transmitted along with a polling signal and a command to write data to the RF-tag. The RF-tag receives the polling signal, the write command, and the data, and uses the polling signal as power for writing the data into memory for archival. To retrieve data, the test device sends a polling signal along with a command to read data to the RF-tag. The RF-tag uses the polling signal as power for reading the requested data from memory and transmitting it to the test device. (Note that if the RF-tag is active, the polling signal is not required for powering the RF-tag).

FIG. 3 illustrates an embodiment where the data collection device is located on the component and includes a processor and sensors for collecting data, as opposed to the independent hand held device of FIG. 1. As illustrated, the data collection device of FIG. 3 includes a processor 28, antenna (transceiver) 18, electronics 22 and memory 24. These can be discrete parts or an integrated circuit. Further, there are currently known RF-tags that include memory and inputs for receiving data from sensors. These RF-tags also include memory for data storage. In this instance, the RF-tag would have inputs connected to sensors and probes for received data about the component. When the RF-tag is polled by a remote test device, the RF-tag receives data from the inputs connected to the sensors and stores the data in the memory of the RF-tag. The remote device can then later poll the RF-tag to retrieve the data logs stored for each test of the component.

As an alternative to the embodiments of FIGS. 1 and 3, the systems and methods of the present invention may include various data collection devices 12 connected to various components 14 in a system. Each of the data collection devices is situated to store archival data concerning test and maintenance data associated with the component to which it is associated. Importantly, the system of this embodiment further includes a centralized test device. The centralized test device is located proximate to the data collection devices and controls their operation. The system of this embodiment is used to test and maintain all of the components on the system. In one embodiment, the centralized test device is similar to the hand held device of FIG. 1, in that it performs test and maintenance procedures on each of the components and transmits the test and maintenance data to the data collection device associated with the component for archival. In this instance, the centralized processor performs the tests and the data collection devices are archival storage units.

In an alternative embodiment, the system is more like that of FIG. 3 in that the data collection devices each include processors 28, antennas 18, electronics 22, and memory 24. The processor includes inputs for connection to sensors and probes that sense data related to component. In this embodiment, instead of the centralized processor performing that actual test and maintenance on the components, the centralized processor instead directs each of the data collection devices to collect data from the sensors and probes associated with each data collection device. The data collection devices collect the data and store it in their associated memories. The data may also be transmitted to the centralized processor for analysis or transmission to a central computing facility where the data is made available to those interested in the maintenance of the component. As discussed previously the data may be transmitted from the centralized processor to the central computing system using any means of communication including Qualcomm's satellite-based communication system or Vehicle Enhancement System's VESPLEX™ technology.

In the above embodiments, the system of the present typically uses an RF-chip attached to the battery or alternator for data storage, however, it must be understood that other technology can be used in place of the RF-chip. For example, in one embodiment, a device known in the industry as an iButton® could replace the RF-chip. iButtons are devices manufactured and marketed by Dallas Semiconductor Corp. An iButton® is a computer chip that is encased in stainless steel. The computer chip contains memory for data storage. Information is transferred between an iButton and a test device with a momentary contact of a specialized wand. The wand transfers information to and from the iButton. More information concerning the iButton is available at the following web site: http://www.ibutton.com/ibuttons/index.html.

In an alternative embodiment, the RF-chip can be replaced with a processor, memory device, and IR transceiver. In this embodiment, the test device further includes a transceiver for communicating information via IR between the test device and the processor for retrieval and storage of information in the memory device.

Further, the RF-chip can be replaced with a processor, memory device, and RF transceiver. In this embodiment, communications between the processor and memory and the test device are performed using a modulated RF signal such as FSK, PWM, or even BLUETOOTH technology.

The above embodiments illustrate the use of RF-chips and other similar devices for testing batteries and alternators, however, it must be understood that these concepts can be expanded to other electrical and mechanical equipment on the vehicle. For example, various sensors may be placed on the vehicle to sense information such as fluid levels, temperatures, etc. Connected to the sensors are RF-chips and possibly storage devices. In operation, a test device is used to poll the various RF-chips. Information from the sensors is then provided to the test device via communication with the RF-chip. In addition, the information may also be stored in the memory associated with the RF-chip. As in some of the embodiments discussed above, a processor may also be included with the RF-chip to poll the sensors on a continuous or periodic basis. Further, this test information may be stored in the memory associated with the RF-chip.

As such, information concerning the various components of a vehicle can be provided without requiring a technician to physically access the various components. Instead, the technician can merely communicate with the various RF-chips using the test device.

In summary, the present invention provides systems and methods for testing and data storage of information related to the electrical system of a vehicle. The present invention provides a data collection device having a memory located on the component to be tested, such as a battery or alternator. The system further includes a test device that communicates with the data collection device to store test data concerning the component of the vehicle. The test device is also used to perform analysis of the current test data and of previous test data stored in the memory of the data collection device and provide information concerning the health of the component. This information can then be used to determine the life expectancy of the component. It may further be used in determining whether warranty claims will be satisfied on defective components.

Figure 4A:
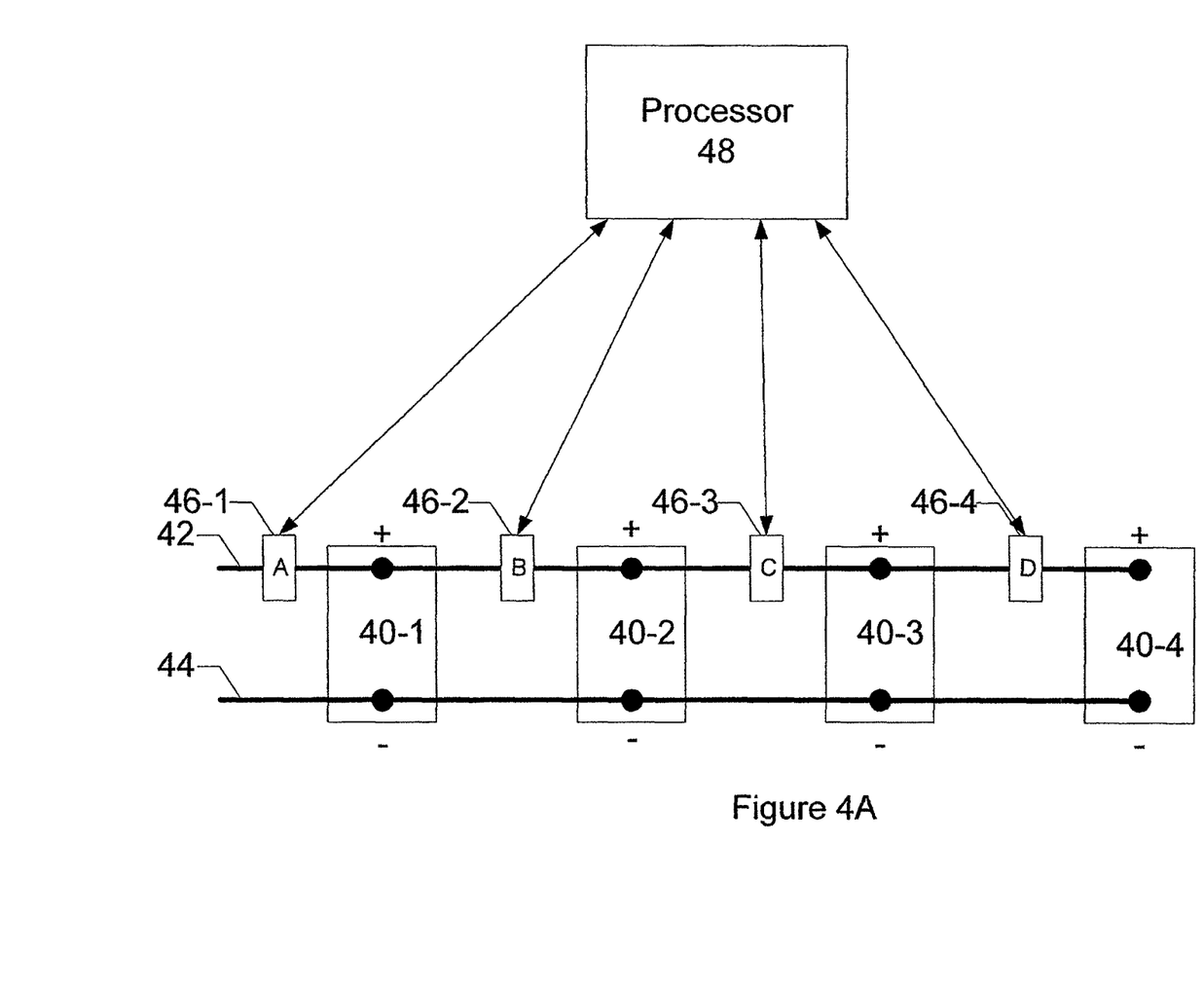
FIGS. 4A and 4B illustrate alternative embodiments for testing and determining which of a number of components in a bank of components may be malfunctioning.
Figure 4B:
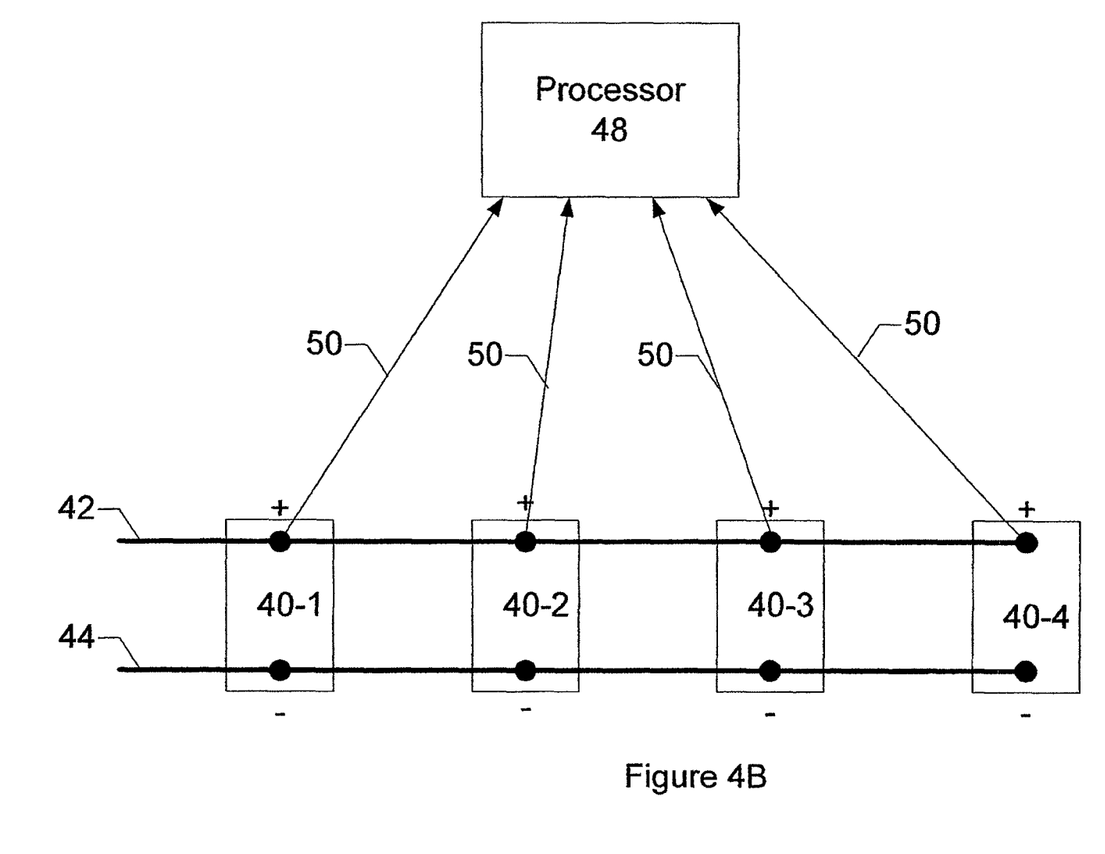

In addition to the various embodiments illustrated above, the present invention also provides systems and methods for testing and determining which of a number of components in a bank of components may be malfunctioning. For example, as depicted in FIGS. 4A and 4B, a typical heavy-duty vehicle includes a plurality of batteries 40-1 thru 40-4 connected in parallel for providing electrical power for different electrical systems of the truck. The positive terminals for each battery are connected together by a conductor 42 and the negative terminals for each battery are connected together by a conductor 44. Importantly, the current provided by the batteries is cumulative.

Specifically, the currents sensed at positions A-D provided respectively by the batteries 40-1 thru 40-4 creates a cumulative output current T=A+B+C+D. By looking at the cumulative current T it is not possible to tell which if any of the batteries may be malfunctioning. As a general matter, if all of the batteries are operating properly, the current draw from each battery during charging and the current supplied by each battery during use should to be the same for each battery within reasonable tolerance. For example, during charging, each battery should draw relatively the same amount of current and likewise, when the batteries are in use, each battery should provide the same amount of current. The present invention evaluates the individual current draw and output of the batteries during different load conditions and from this evaluation determines which, if any, of the batteries are malfunctioning. It must be understood that although the description is discussed in terms of battery performance, that many other electrical components connected in a similar manner may be evaluated using the methods and techniques discussed below.

In particular, as shown in FIG. 4A, the systems and methods of the present invention include individual current sensors 46-1 thru 46-4 connected between each of the batteries 40-1 thru 40-4. The sensors are in communication with a processor 48 via direct connection or via a wireless connection. The sensors sense the current at each terminal of the battery and provide a current reading. By evaluating the current readings provided by each sensor, the systems and methods of the present invention can determine which, if any, of the batteries may be malfunctioning.

For example, when the vehicle is running, the batteries are typically charged by an alternator. In this instance, each of the batteries is drawing a certain amount of current. If one of the batteries appears to be drawing more current than the other batteries, this is an indication that the battery is bad or malfunctioning. For example, in FIG. 4A, when the batteries are charging, current flows from left to right, (i.e., in the direction from battery 40-1 to 40-4). In this instance, the current sensed by the sensor 46-4 will represent the current draw by the battery 40-4. Further, the current sensed by the sensor 46-3 will represent the current draw by both batteries 40-3 and 40-4. Similarly, the current sensed by the sensor 46-2 represents the current draw by batteries 40-2 thru 40-4, and current sensed by the sensor 46-1 represents the current draw by batteries 40-1 thru 40-4. In light of this, the current draw by each battery can be determined by deduction.

For example, in this instance, if sensor 46-4 senses 5 amps, then it is known that battery 40-4 is drawing 5 amps. Further, if sensor 46-3 senses 10 amps and sensor 46-4 is sensing 5 amps, then battery 40-3 is drawing 5 amps. Additionally, if sensor 46-2 senses 15 amps and sensor 46-1 senses 20 amps, then batteries 40-2 and 40-1 are also drawing 5 amps. In this example, each of the batteries is drawing the same amount of current, so it is deduced that all of the batteries are properly functioning. However, if it was determined that one or more of the batteries was drawing more or less current outside a tolerance range from that of the other batteries, then it can be deduced that one or more batteries are malfunctioning. For example, if batteries 40-1 thru 40-3 each draw 5 amps, but battery 40-4 only draws 2 amps, this would be an indication that battery 40-4 may be malfunctioning.

Similar measurements can be performed when the batteries are in use. Specifically, when the engine of the vehicle is off, the alternator is no longer charging the batteries. Instead, the batteries are now supplying power to the electrical systems of the vehicle. In this instance current flows from right to left in FIGS. 4A and 4B. In this instance, if sensor 46-1 indicates 20 amps and sensor 46-2 indicates 15 amps, then battery 40-1 is providing 5 amps. Further, if sensor 46-3 indicates 10 amps, the battery 40-2 is supplying 5 amps, and so on for batteries 40-3 and 40-4. Here again, if one of the batteries appears to be supplying less current than the other batteries, there is likely a problem with one or more of the batteries.

Importantly, by evaluating the current drawn by each battery during charging or supplied during use, the systems and methods of the present invention can detect whether a battery in the system is malfunctioning. The above examples are only illustrative embodiments. A malfunctioning battery may have different affects on the current draw and supply of the system. For example, if battery 40-3 is malfunctioning, it may not only draw current from the alternator when charging, but it may also draw current from battery 40-4. In this instance, it may appear that battery 40-4 when in reality then less measured current of battery 40-4 is due to the added current draw from battery 40-3. To rule out battery 40-4, direction of current flow from the sensor 46-4 would need to be evaluated. If the current is flowing in the opposite direction than it should, then battery 40-3 may be drawing current from battery 40-4. Other similar scenarios are understood that would require evaluation of current direction and current magnitude to determine which batteries are malfunctioning.

FIG. 4A is an illustration of the system of the present invention in which Hall effect or magneto resistive type sensors are used. These sensors operate by detection of the magnetic field generated by the current flowing through conductors. FIG. 4B illustrates an alternative embodiment in which current is determined by voltage measurement. In this embodiment, lead wires 50 are connected to the terminals of the batteries and voltage difference is measured. This voltage difference is caused by the known resistance of the conductors between the two battery terminals. Since the resistance is known and the voltage is measured, the current through the conductors connecting the terminals of batteries can be determined. These currents, once determined, can be used in a similar evaluation manner as previously discussed above. In FIGS. 4A and 4B, the currents are measured using the positive terminal connections of the batteries. It is understood that either the positive or the negative terminals can be used. Specifically, current will be flowing in a similar manner through the negative terminals as it will in the positive terminals. Use of the negative terminals does not provide significant benefits where Hall effect or magneto resistive type sensors are used, because these sensors measure the magnetic flux and not the current directly. However, use of the negative terminals does provide some benefit when, as shown in FIG. 4B, voltage drops across the conductors is measured. Specifically, in instances in which the positive terminals are used, a fuse 52 is required for each lead wire to guard against short circuits. The small gauge sensing wire requires positive temperature coefficient PCT or a similar fuse device. However, when the sensing lead wires of FIG. 4B are connected to the negative terminals of the battery, a fuse is not typically required.

Figure 5:
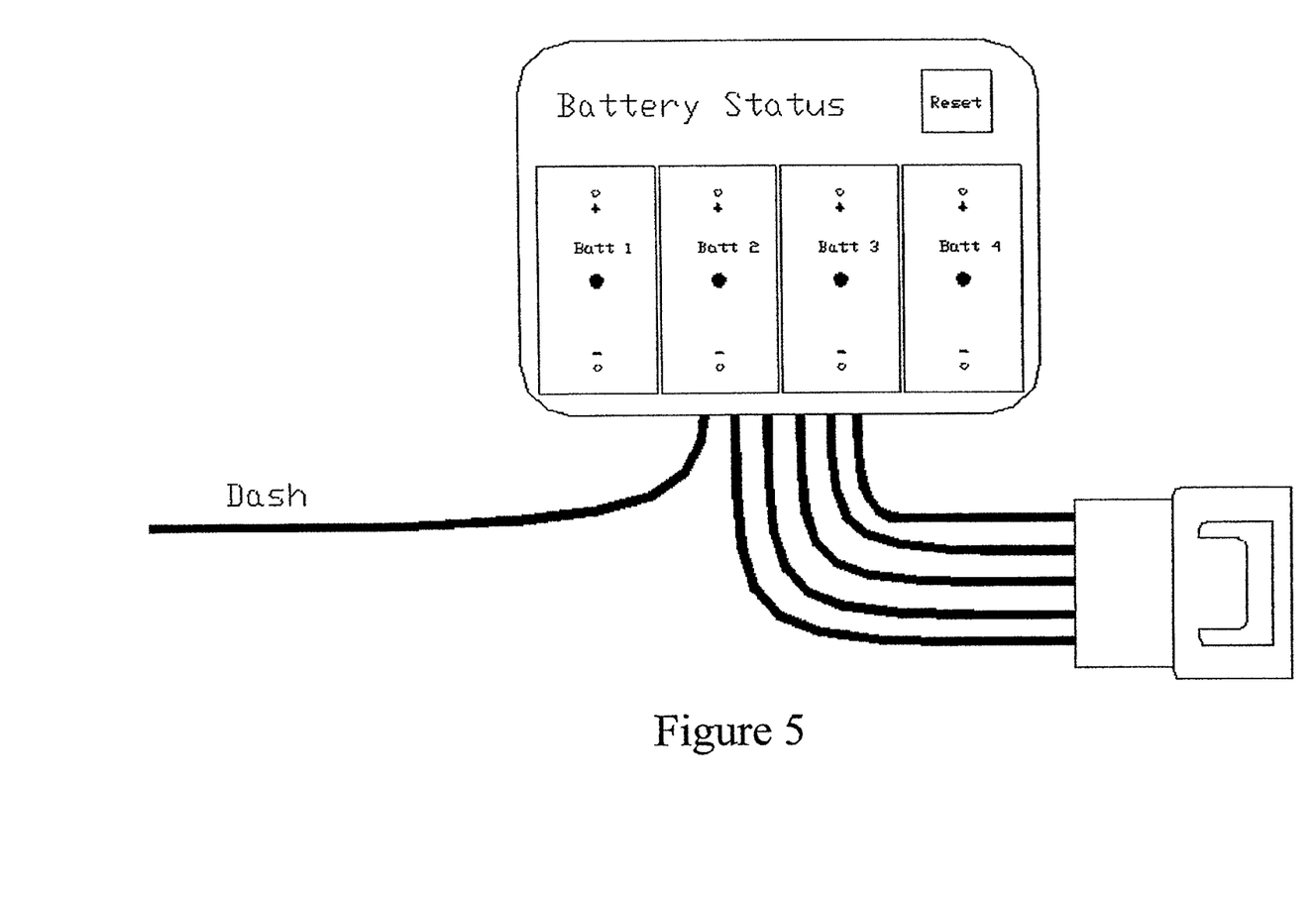
FIG. 5 illustrates a visual indicator according to one embodiment of the present invention for indicating a malfunction of a component to a user.

FIG. 5 is an illustrative embodiment of a display that can be provided to a user of the system and method of this embodiment. The display provides a visual indication concerning the health of each of the batteries and can provide visual or aural alerts when a battery is indicated as malfunctioning.

The systems and methods of this embodiment of the present invention provide for testing and data storage of information related to the electrical system of the vehicle directed to the batteries and indirect analysis of the starting circuit, charging circuit, and all other electrical devices on the vehicle. This systems and methods of this embodiment provide the ability to analyze each battery and the total system by the use of either a Hall effect sensor, magneto resistive type sensor or voltage drop measurements downstream to each battery. The ability to store, analyze and compare the current data during starting, charging and other load conditions with all the batteries at the same temperature allow the systems and methods of the present invention to distinguish good, bad and marginal batteries. Storing the data, broadcasting this data on SAE J1708/1587 or SAE J1939 allow typical diagnostics for the trucking industry. Also, storage of this data in separate RF device, located at each Hall Effect Sensor "Poker Chip" or a single "Poker Chip" located at the microprocessor as discussed in earlier embodiments above are an alternate method for communication to a hand held or roadside reader.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A data collection device for use with an electrical component of an electrical system, the data collection device comprising:
   a memory configured to store data associated with the electrical component that is selected from the group consisting of maintenance data from a maintenance procedure run on the electrical component and provided by a test device offboard the data collection device, test data from the test device offboard the data collection device, fleet name, technician comments and a health analysis based upon a comparison of current data to historical data from the test device offboard the data collection device;
   a radio frequency (RF) chip comprising an antenna and electronics configured to communicate offboard from the data collection device via the antenna so as to receive the data associated with the electrical component for storage by the memory, wherein the electronics are configured to provide for transmission of the data associated with the electrical component; and
   an encasement configured to support the memory and the RF chip, wherein the encasement is configured to be carried by a vehicle along with the electrical component.

2. A data collection device according to claim 1 wherein the encasement is comprised of a material selected from the group consisting of plastic, epoxy and rubber.

3. A data collection device according to claim 1 further comprising an adhesive configured to attach the encasement to the component.

4. A data collection device according to claim 3 wherein the adhesive is configured to attach the encasement to an exterior surface of a battery.

5. A data collection device according to claim 1 wherein the electronics comprises a transceiver.

6. A data collection device according to claim 1 wherein the memory is configured to store test and maintenance data selected from the group consisting of a level of charge of the component, a duration of charge, cold cranking amps, and a reserve charge level.

7. A data collection device according to claim 1 further comprising an internal clock configured to facilitate time stamping of the data.

8. A data collection device according to claim 1 further comprising a processor configured to analyze at least some of the data stored by the memory.

9. A system comprising:
   an electrical component of an electrical system of a vehicle; and
   a data collection device carried by the vehicle along with the electrical component, wherein the data collection device comprises:
      a memory configured to store data associated with the electrical component that is selected from the group consisting of maintenance data from a maintenance procedure run on the electrical component and provided by a test device offboard the data collection device, test data from the test device offboard the data collection device, fleet name, technician comments and a health analysis based upon a comparison of current data to historical data from the test device offboard the data collection device;
      a radio frequency (RF) chip comprising an antenna configured to receive the data associated with the electrical component for storage by the memory; and
      an encasement configured to support the memory and the RF chip, the antenna and the electronics, wherein the encasement is comprised of a material selected from the group consisting of plastic, epoxy and rubber.

10. A system according to claim 9 wherein the component comprises a battery.

11. A system according to claim 9 further comprising an adhesive configured to attach the encasement to the component.

12. A system according to claim 9 wherein the memory is configured to store test and maintenance data selected from the group consisting of a level of charge of the component, a duration of charge, cold cranking amps, and a reserve charge level.

13. A system according to claim 9 further comprising an internal clock configured to facilitate time stamping of the data.

14. A system according to claim 9 further comprising a processor configured to analyze at least some of the data stored by the memory.

15. A system comprising:
a data collection device carried along with an electrical component of an electrical system, wherein the data collection device comprises:
  a memory configured to store data associated with the electrical component and selected from the group consisting of maintenance data from a maintenance procedure run on the electrical component, test data, fleet name, technician comments and a health analysis based upon a comparison of current data to historical data;
  a radio frequency (RF) chip comprising an antenna configured to provide for communications of the data associated with the electrical component offboard from both the data collection device and the electrical component; and
  an encasement configured to support the memory and the RF chip; and
a test device offboard of the data collection device and configured to run a maintenance procedure or perform a test operation on the electrical component and to communicate with the data collection device via the antenna in order to store information concerning the maintenance procedure or the test operation performed offboard by the test device in the memory of the data collection device such that the information concerning the maintenance procedure or the test operation performed offboard by the test device is resident with the electrical component.

16. A system according to claim 15 wherein the encasement permits the data collection device to be independently contained separate from the component.

17. A system according to claim 15 wherein the component comprises a battery.

18. A system according to claim 15 wherein the memory is configured to store test and maintenance data selected from the group consisting of a level of charge of the component, a duration of charge, cold cranking amps, and a reserve charge level.

19. A system according to claim 15 further comprising an internal clock configured to facilitate time stamping of the data.

* * * * *